US010881012B1

(12) United States Patent
Wu et al.

(10) Patent No.: US 10,881,012 B1
(45) Date of Patent: Dec. 29, 2020

(54) ANTI-DISMANTLE DEVICE

(71) Applicant: Delta Electronics, Inc., Taoyuan (TW)

(72) Inventors: Chang-Yen Wu, Taoyuan (TW); Tien-Wei Lan, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 16/707,340

(22) Filed: Dec. 9, 2019

(30) Foreign Application Priority Data

Sep. 17, 2019 (CN) .......................... 2019 1 0874310

(51) Int. Cl.
*H05K 5/02* (2006.01)
*H05K 5/00* (2006.01)

(52) U.S. Cl.
CPC .......... *H05K 5/0208* (2013.01); *H05K 5/0013* (2013.01)

(58) Field of Classification Search
CPC .......................... H05K 5/0013; H05K 5/0221
See application file for complete search history.

(56) References Cited

U.S. PATENT DOCUMENTS

| 5,379,912 A * | 1/1995 | Wolf | B60R 16/0239 |
| | | | 220/241 |
| 2014/0096467 A1 * | 4/2014 | Norton | E04F 13/0833 |
| | | | 52/582.2 |
| 2017/0127541 A1 * | 5/2017 | Kaihara | H05K 5/006 |
| 2018/0097214 A1 * | 4/2018 | Ogawa | H05K 5/0213 |
| 2019/0289727 A1 * | 9/2019 | Liu | H05K 5/0256 |

FOREIGN PATENT DOCUMENTS

| CN | 205050299 U | 2/2016 |
| TW | I415554 B | 11/2013 |
| TW | M473449 U | 3/2014 |
| TW | I514190 B | 12/2015 |
| TW | M541692 U | 5/2017 |
| TW | I590030 B | 7/2017 |

* cited by examiner

*Primary Examiner* — Mukundbhai G Patel
(74) *Attorney, Agent, or Firm* — Kirton McConkie; Evan R. Witt

(57) ABSTRACT

An anti-dismantle device is provided. The anti-dismantle device includes an upper case, a lower case, an elastic element, a magnet element, a plurality of balls and a cover. The upper case includes a pin including a groove. The lower case is detachably assembled with the upper case and comprises a receiving part comprising an accommodation space. The elastic element, the magnet element and the balls are disposed in the accommodation space. At least portion of the pin penetrates through the cover, the receiving part, the magnet element and the elastic element and is disposed in the accommodation space. Each ball is partially accommodated in the groove. In response to an elastic force of the elastic element, the magnet element cooperates with the cover to press against the balls for allowing the balls to be fastened in the groove, so that the upper case and the lower case are assembled.

7 Claims, 12 Drawing Sheets

ANTI-DISMANTLE DEVICE

CROSS-REFERENCE TO RELATED APPLICATION

This application claims priority to China Patent Application No. 201910874310.9, filed on Sep. 17, 2019. The entire contents of the above-mentioned patent application are incorporated herein by reference for all purposes.

FIELD OF THE INVENTION

The present invention relates to an anti-dismantle device, and more particularly to an anti-dismantle device without detachable portion in outward appearance thereof.

BACKGROUND OF THE INVENTION

Nowadays, anti-dismantle device has been widely employed to enclose electronic elements of an electronic product so as to prevent the electronic elements from being damaged or prevent the electronic product from being inadvertently disassembled by the user to expose the electronic elements. Generally, the anti-dismantle device comprises an upper case and a lower case. There are two methods of assembling the upper case and the lower case to achieve the anti-dismantle purposes. In the first method, the upper case and the lower case are assembled together by screws. However, the anti-dismantle device has obvious detachable portion in the outward appearance thereof while the screws are employed to assemble the upper case and lower case. The user uses a screwdriver to take the screws apart from the anti-dismantle device easily. Consequently, unintended disassembly of the anti-dismantle device performed by the user may occur easily, which results in damage of the electronic elements.

In the second method, the upper case and the lower case are assembled together by hooks. Unintended disassembly of the anti-dismantle device performed by the user may not occur easily while the hooks are employed to assemble the upper case and the lower case. However, as the anti-dismantle device is needed to be disassembled, the upper case and the lower case are dismantled with destructive method. Consequently, the anti-dismantle device has irreversible demolition vestige, and the upper case and the lower case may be damaged at the same time.

Therefore, there is a need of providing an anti-dismantle device so as to address the issues encountered by the prior arts.

SUMMARY OF THE INVENTION

An object of the present invention provides an anti-dismantle device. The anti-dismantle device has no detachable portion in the outward appearance thereof so that unintended disassembly of the anti-dismantle device is prevented. In addition, no demolition vestige is generated on the anti-dismantle device while the anti-dismantle device is required to be disassembled.

In accordance with an aspect of the present invention, an anti-dismantle device is provided. The anti-dismantle device includes an upper case, a lower case, at least one elastic element, at least one magnet element, a plurality of balls and at least one cover. The upper case comprises at least one pin. The pin includes a groove. The lower case is detachably assembled with the upper case and includes at least one receiving part. The receiving part is disposed corresponding in position to the pin and includes an accommodation space. The at least one elastic element is disposed in the accommodation space. The at least one magnet element is disposed in the accommodation space and located between the elastic element and an opening of the accommodation space, and the at least one magnet element presses against the elastic element. The plurality of balls are disposed in the accommodation space and located between the magnet element and the opening of the accommodation space, and the plurality of balls are in contact with the magnet element. The at least one cover is fitted in the receiving part and covers the opening of the accommodation space. At least portion of the pin penetrates through the cover, the receiving part, the magnet element and the elastic element and is disposed in the accommodation space. Each of the plurality of balls is partially accommodated in the groove of the pin. In response to an elastic force of the elastic element, the magnet element cooperates with the cover to press against the plurality of balls for allowing the plurality of balls to be fastened in the groove, so that the upper case and the lower case are assembled together.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
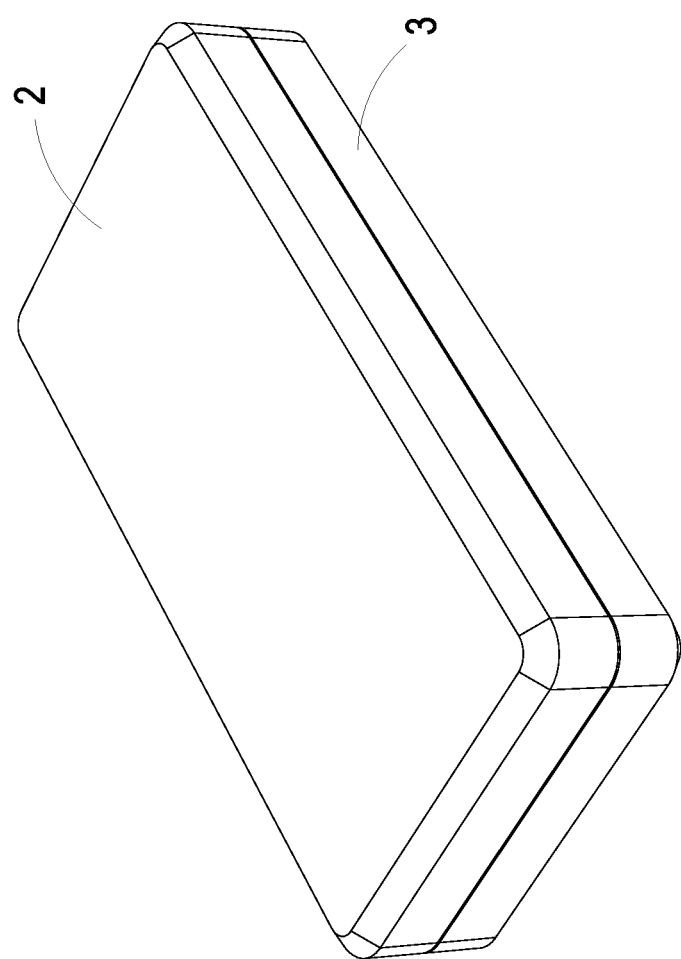
FIG. 1 is a schematic perspective view illustrating an anti-dismantle device according to a first embodiment of the present invention.
Figure 2:
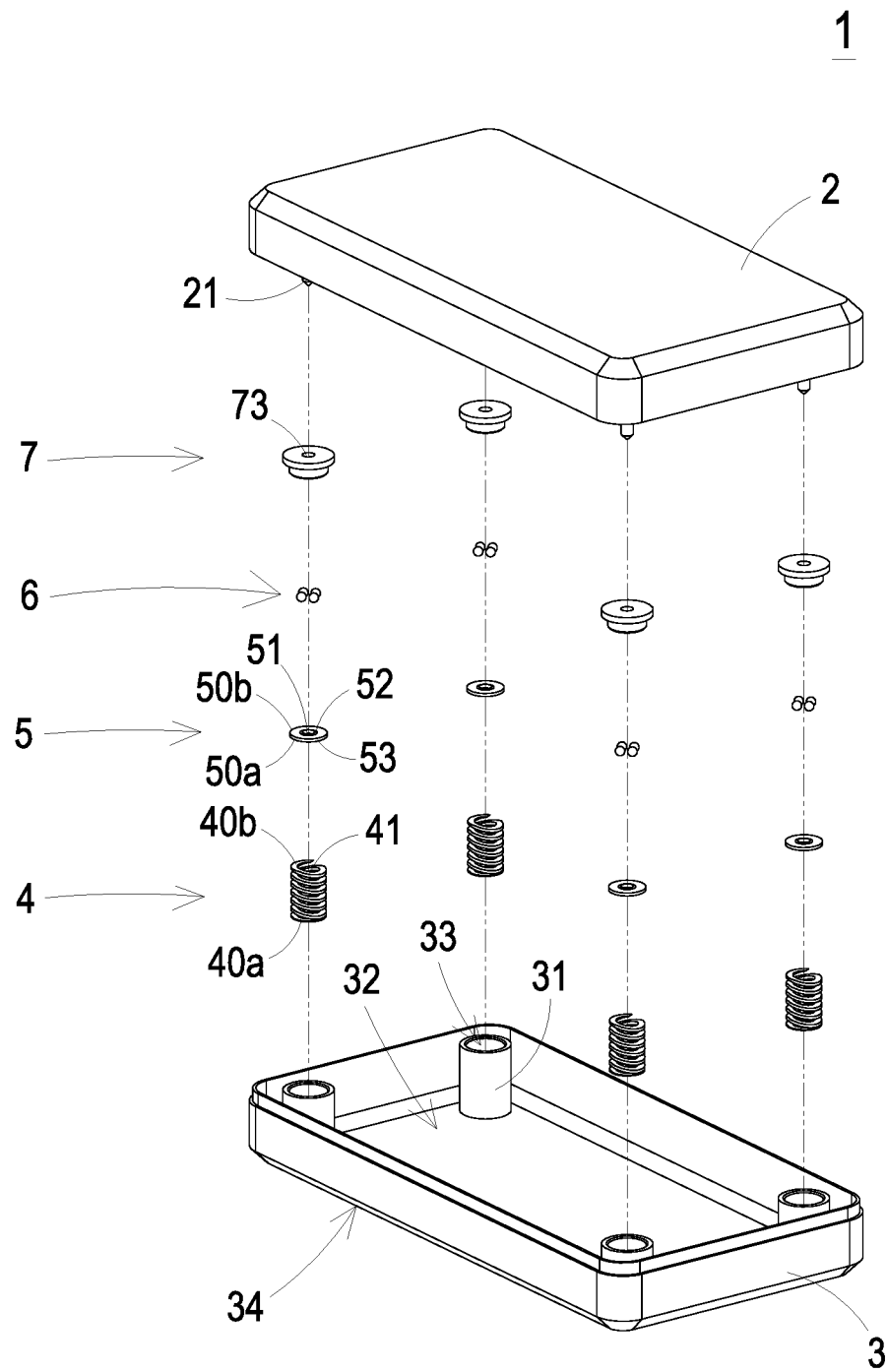
FIG. 2 is a schematic exploded view illustrating the anti-dismantle device of FIG. 1 and taken at a first viewpoint.
Figure 3:
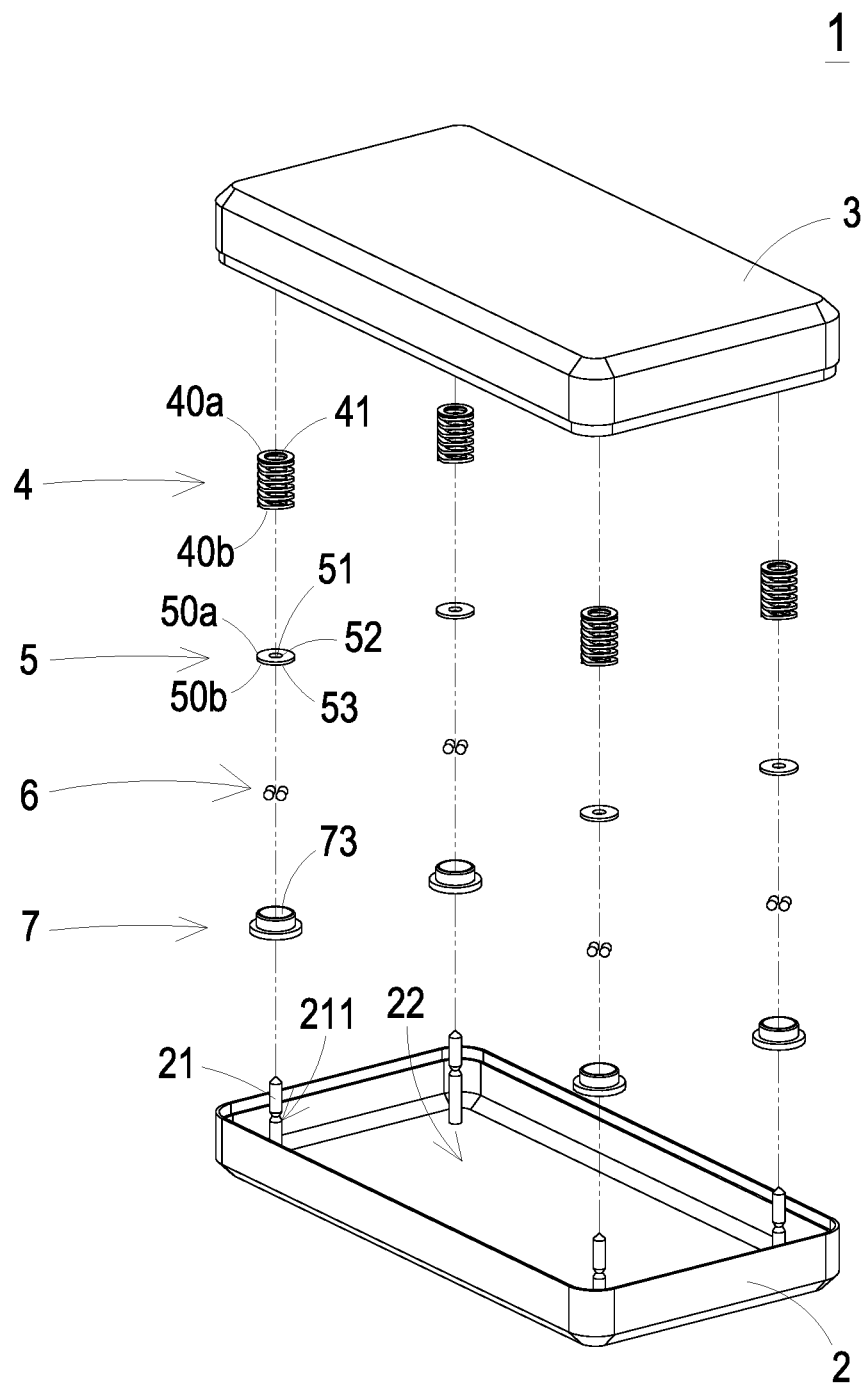
FIG. 3 is a schematic exploded view illustrating the anti-dismantle device of FIG. 1 and taken at a second viewpoint opposite to the first viewpoint.
Figure 4:
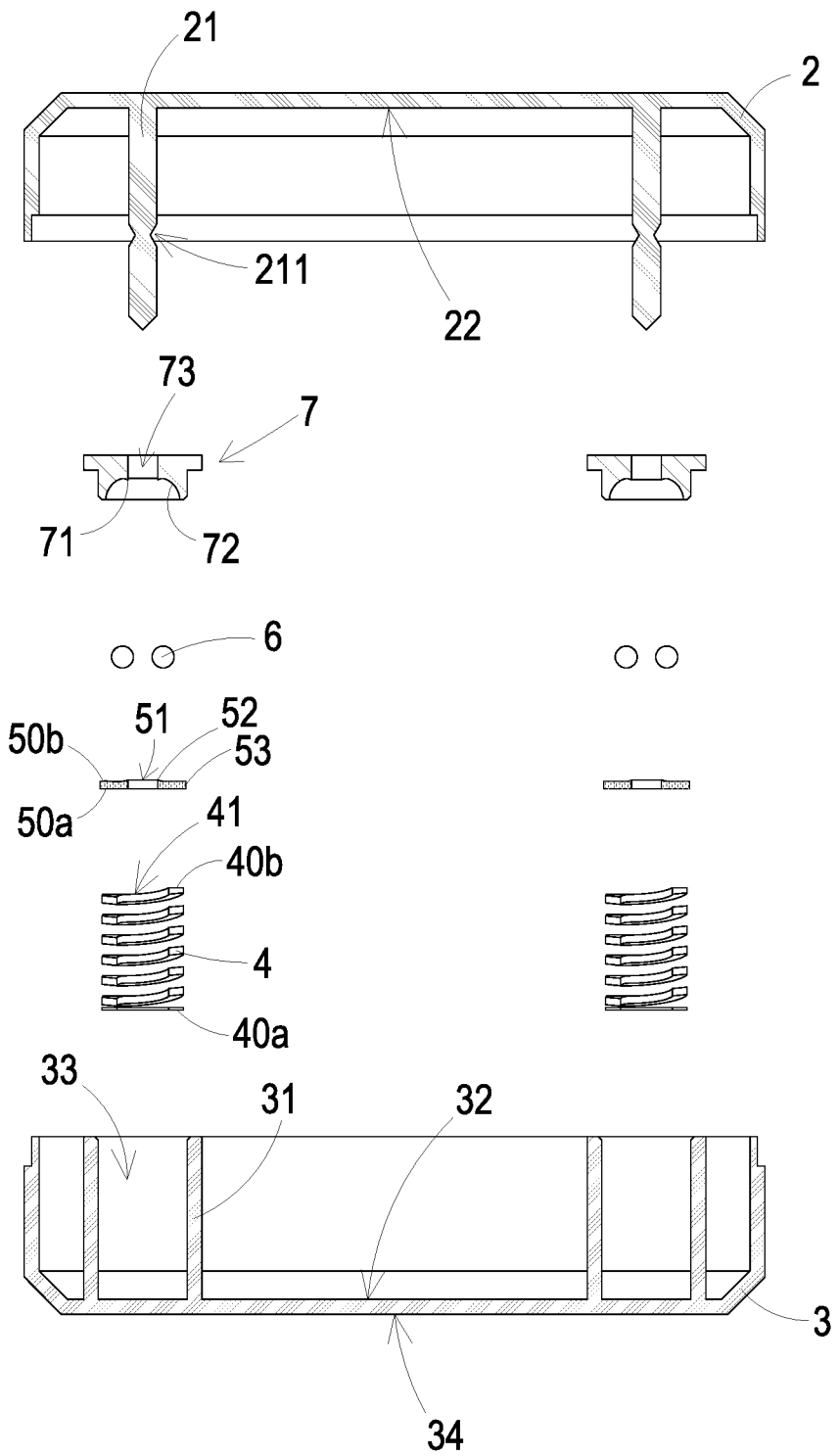
FIG. 4 is a schematic cross-sectional exploded view illustrating the anti-dismantle device of FIG. 1.
Figure 5:
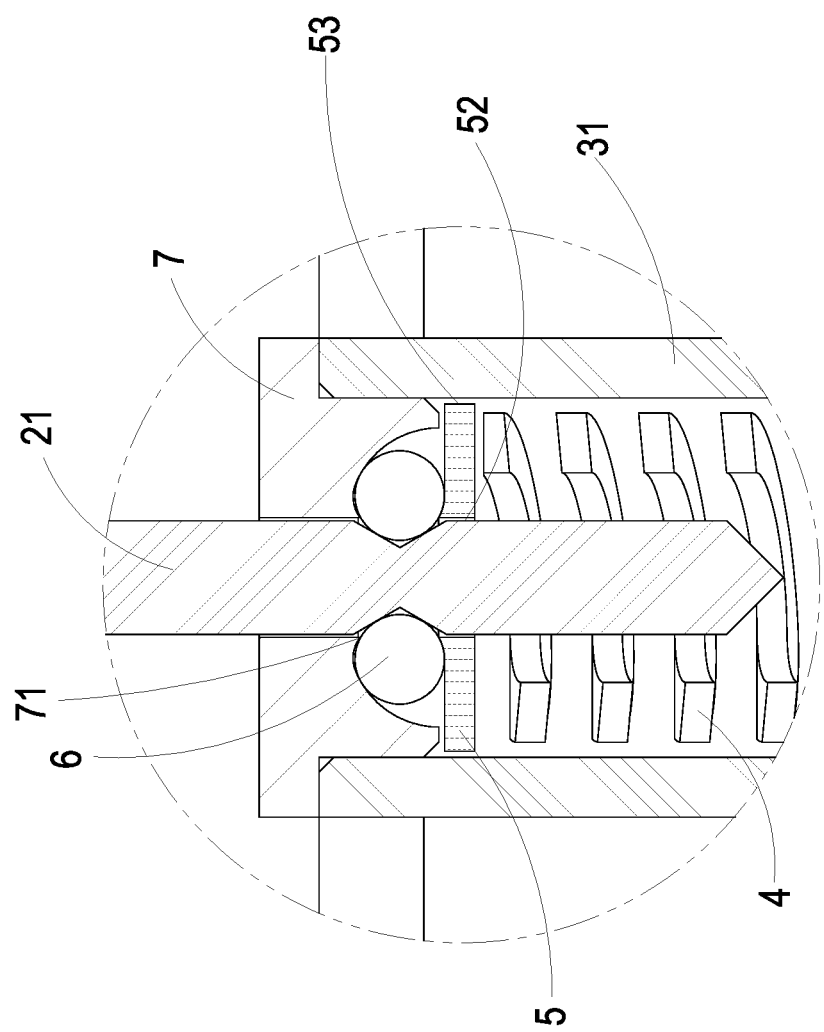
FIG. 5 is a schematic cross-sectional view illustrating a part of the anti-dismantle device of FIG. 1.
Figure 6:
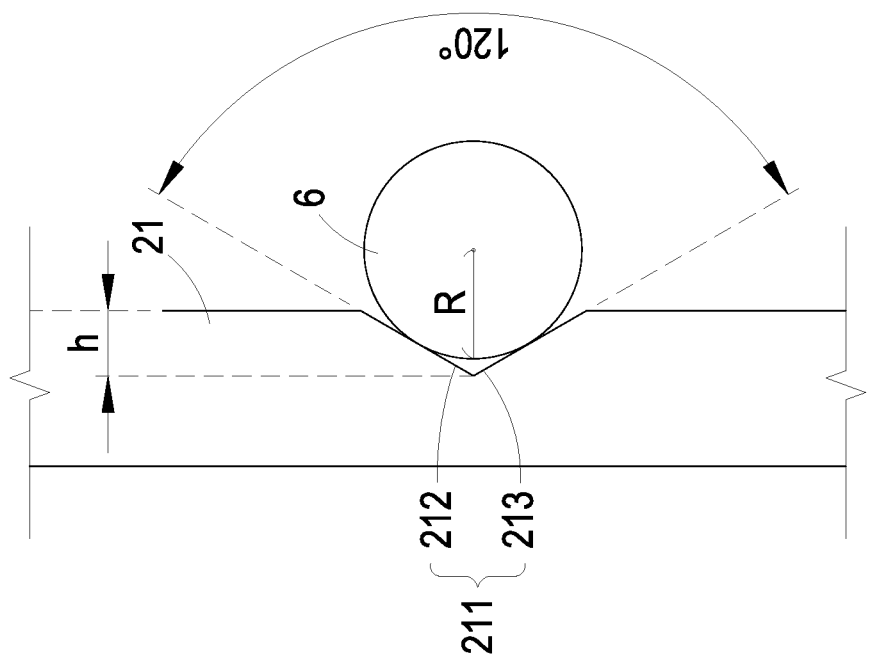
FIG. 6 shows the relationship between a plurality of balls and a groove of the anti-dismantle device of FIG. 1.

FIG. 1 is a schematic perspective view illustrating an anti-dismantle device according to a first embodiment of the present invention. FIG. 2 is a schematic exploded view illustrating the anti-dismantle device of FIG. 1 and taken at a first viewpoint. FIG. 3 is a schematic exploded view illustrating the anti-dismantle device of FIG. 1 and taken at a second viewpoint opposite to the first viewpoint. FIG. 4 is a schematic cross-sectional exploded view illustrating the anti-dismantle device of FIG. 1. FIG. 5 is a schematic cross-sectional view illustrating a part of the anti-dismantle device of FIG. 1. FIG. 6 shows the relationship between a plurality of balls and a groove of the anti-dismantle device of FIG. 1. As shown in FIGS. 1 to 6, the anti-dismantle device 1 is used to cover electronic component (not shown in figure). The anti-dismantle device 1 includes an upper case 2, a lower case 3, at least one elastic element 4, at least one magnet element 5, a plurality of balls 6 and at least one cover 7.

The upper case 2 includes at least one pin 21. The pin 21 is disposed on a first inner surface 22 of the upper case 2. Preferably but not exclusively, the upper case 2 and the pin 21 are integrally formed into one piece. In some embodiments, the pin 21 is detachably fastened to the upper case 2. The pin 21 is a cylindrical post and includes a groove 211. The groove 211 is disposed around the outer periphery of the pin 21 and concavely formed one the outer periphery of the pin 21.

The lower case 3 is detachably assembled with the upper case 2. The lower case 3 and the upper case 2 conjointly enclose at least one electronic component therein. The lower case 3 includes at least one receiving part 31. The receiving part 31 is disposed on a second inner surface 32 of the lower case 3 and is extending outwardly from the second inner surface 32 toward the upper case 2. Preferably, the receiving part 31 is perpendicular to the second inner surface 32 of the lower case 3. The receiving part 31 is corresponding in position to the pin 21. Moreover, the receiving part 31 has a hollow structure to define an accommodation space 33. The opening of the accommodation space 33 faces to the upper case 2. Preferably, the receiving part 31 is a bore column.

In an embodiment, the elastic element 4 is for example but not limited to a spring. The elastic element 4 is disposed in the accommodation space 33. A first end 40a of the elastic element 4 presses against the second inner surface 32 of the lower case 3. The magnet element 5 can be attracted by a magnet member 8 (see FIG. 7C), so that the magnet element 5 is moved in response to the attracting force of the magnet member 8. Preferably but not exclusively, the magnet element 5 is an iron sheet or a magnetic sheet. The magnet element 5 is a magnet disc having a hollow structure. The magnet element 5 is disposed in the accommodation space 33 and located between the elastic element 4 and the opening of the accommodation space 33. Moreover, the magnet element 5 includes a first side 50a and a second side 50b opposite to each other. The first side 50a of the magnet element 5 presses against a second end 40b of the elastic element 4.

As shown in FIG. 2, in this embodiment, the amount of the plurality of balls 6 is four. It is noted that the amount of the plurality of balls 6 is not limited to four and can be varied according to the practical requirements as long as the amount of the plurality of balls 6 are enough to be disposed in the groove 211 of the pin 21 stably and allow the lower case 3 and the upper case 2 to be assembled firmly. The plurality of balls 6 are disposed in the accommodation space 33 and located between the magnet element 5 and the opening of the accommodation space 33. The plurality of balls 6 are in contact with the second side 50b of the magnet element 5. The cover 7 has a hollow structure. As the elastic element 4, the magnet element 5, the plurality of balls 6 are disposed in the accommodation space 33, the cover 7 is fitted in receiving part 31 to cover the opening of the accommodation space 33. Consequently, the elastic element 4, the magnet element 5 and the plurality of balls 6 disposed in the accommodation space 33 are blocked by the cover 7 and can't be removed from the accommodation space 33.

Moreover, in this embodiment, as the upper case 2 is assembled with the lower case 3, at least portion of the pin 21 penetrates through the cover 7, the receiving part 31, the magnet element 5 and the elastic element 4 and is disposed in the accommodation space 33. Meanwhile, each of the plurality of balls 6 is partially accommodated in the groove 211 of the pin 21. In response to an elastic force of the elastic element 4, the magnet element 5 cooperates with the cover 7 to press against the plurality of balls 6 for allowing the plurality of balls 6 to be fastened in the groove 211 of the pin 21, so that each of the plurality of balls 6 can't be removed from the groove 211 of the pin 21. Namely, the pin 21 is latched by the plurality of balls 6. Consequently, the upper case 2 and the lower case 3 are assembled and fastened to each other firmly.

Figure 7A:
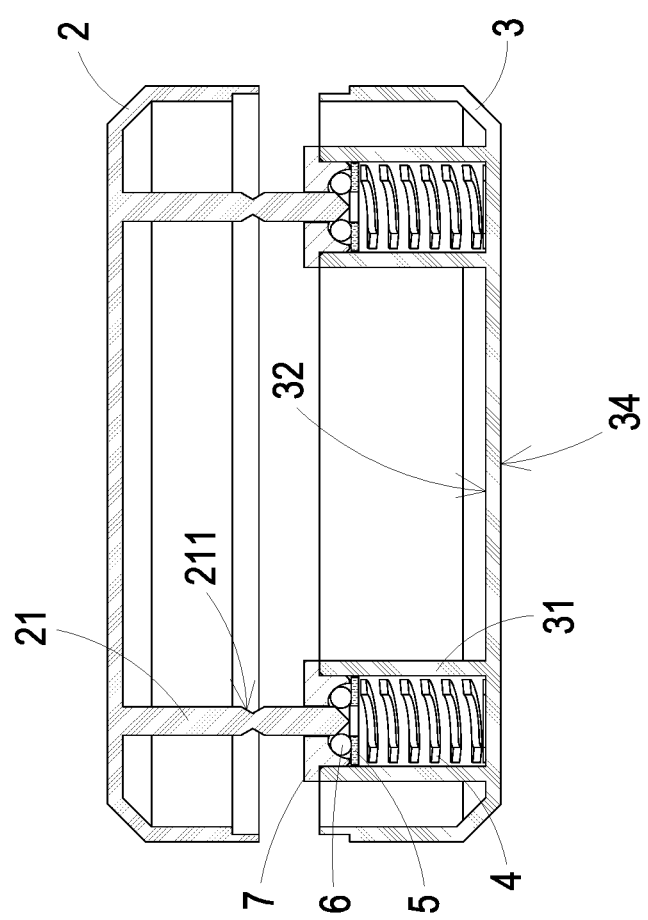
FIG. 7A is a schematic cross-sectional view illustrating the anti-dismantle device of FIG. 1, wherein an upper case and a lower case of the anti-dismantle device are assembling.
Figure 7B:
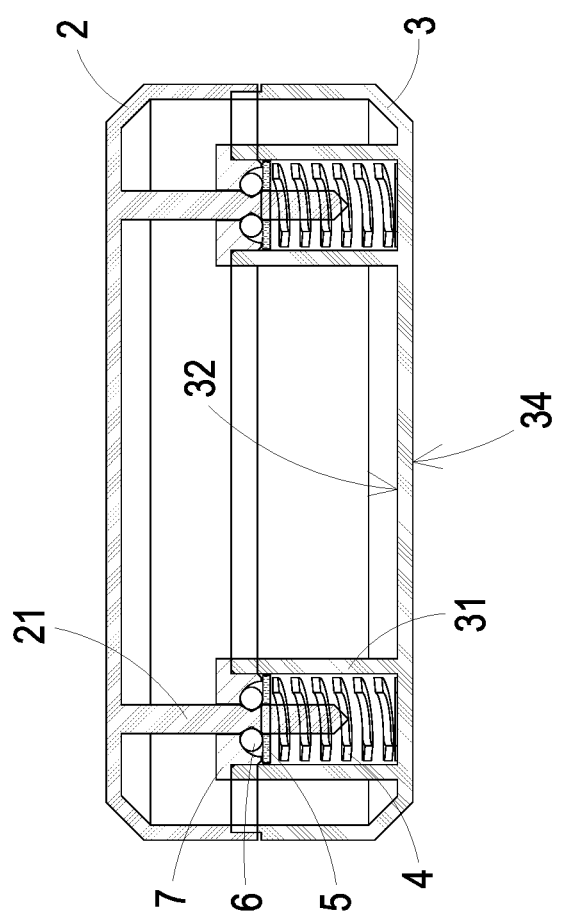
FIG. 7B is a schematic cross-sectional view illustrating the anti-dismantle device of FIG. 1, wherein the upper case and the lower case of the anti-dismantle device are assembled completely.
Figure 7C:
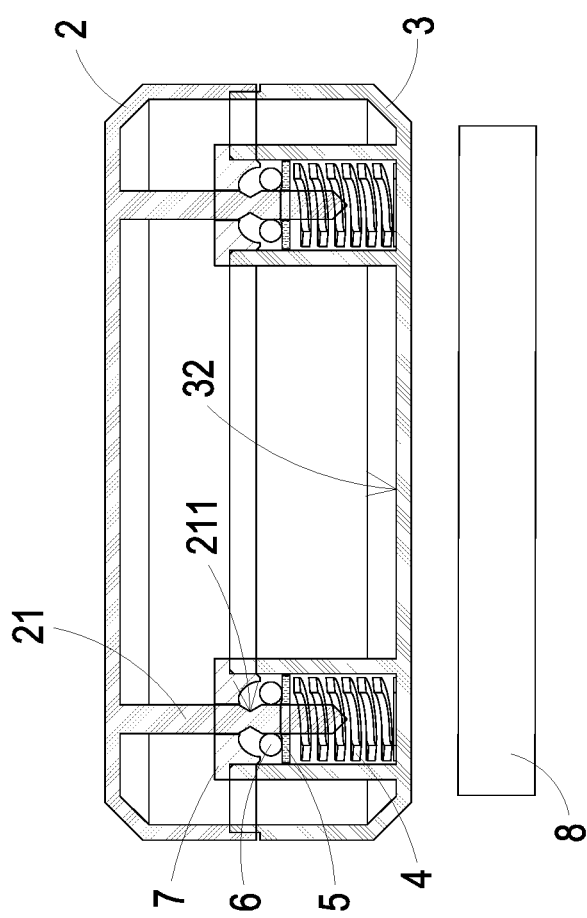
FIG. 7C is a schematic cross-sectional view illustrating the anti-dismantle device of FIG. 1, wherein a magnet element of the anti-dismantle device is attracted by a magnet member while the anti-dismantle device is disassembled.

An exemplary method of assembling and disassembling the upper case 2 and the lower case 3 of the anti-dismantle device 1 is described below. FIG. 7A is a schematic cross-sectional view illustrating the anti-dismantle device of FIG. 1, wherein the upper case and the lower case of the anti-dismantle device are assembling. FIG. 7B is a schematic cross-sectional view illustrating the anti-dismantle device of FIG. 1, wherein the upper case and the lower case of the anti-dismantle device are assembled completely. FIG. 7C is a schematic cross-sectional view illustrating the anti-dismantle device of FIG. 1, wherein a magnet element of the anti-dismantle device is attracted by a magnet member while the anti-dismantle device is disassembled. Please refers to FIGS. 1 to 6 and FIGS. 7A to 7C. As shown in FIG. 7A, as the upper case 2 is required to be assembled with the lower case 3, the pin 21 of the upper case 2 penetrates through the cover 7, the receiving part 31, the magnet element 5 and the elastic element 4 and is disposed in the accommodation space 33 gradually. As shown in FIG. 7B, as the pin 21 moves toward the accommodation space 33 continuously for allowing the upper case 2 to be assembled with the lower case 3 completely, each of the plurality of balls 6 is partially accommodated in the groove 211 of the pin 21. Meanwhile, the elastic element 4 applies elastic force on the magnet element 5, so that the magnet element 5 applies force on the plurality of balls 6 synchronously. Moreover, the cover 7 is fitted in the receiving part 31 to cover the opening of the accommodation space 33. The plurality of balls 6 are pressed against by the cover 7 and the magnet element 5, respectively, and are restricted to move. Consequently, the plurality of balls 6 are fixed in the groove 211 of the pin 21 and can't be removed from the groove 211 of the pin 21. Hence, the upper case 2 and the lower case 3 are fastened to each other and can't be disassembled.

On the contrary, as shown in FIG. 7C, as the assembly of the upper case 2 and the lower case 3 is required to be disassembled, a magnet member 8 is employed to be disposed on an outer surface 34 of the lower case 3 corresponding in position to the magnet element 5. The magnet element 5 is attracted by the magnet member 8 so that the magnet element 5 moves along the accommodation space 33 toward the second inner surface 32 of the lower case 3. Moreover, the magnet element 5 presses against the elastic element 4 so that the magnet element 5 drives the elastic element 4 to be compressed in a direction toward the second inner surface 32 of the lower case 3 synchronously. Under this circumstance, the magnet element 5 fails to apply force on the plurality of balls 6 so that the plurality of balls 6 are free to be removed from the groove 211 of the pin 21. The magnet element 5 and the plurality of balls 6 disposed on the magnet element 5 move toward the second inner surface 32 of the lower case 3 synchronously. Therefore, the pin 21 of the upper case 2 can be removed from the accommodation space 33 for allowing the upper case 2 and the lower case 3 to be disassembled. Preferably but not exclusively, the magnet member 8 is a permanent magnet plate or an electromagnet plate. The elastic element 4 is a spring.

In some embodiments, as the magnetic field power of the magnet member 8 achieves the magnetic field power represented as the following formula (1), the plurality of balls 6 can be removed from the groove 211 of the pin 21 so that the upper case 2 and the lower case 3 are disassembled.

$$25 \sim 100 \, N \text{ spring} < N \text{ magnet} \tag{1}$$

In the above formula (1), N is represented as the Newton force. Spring is represented as the elastic element 4 (i.e. the spring). Magnet is represented as the magnet member 8. 25~100 is represented as the multiple. The meaning of the above formula (1) is that the power of the magnet member 8 is greater than 25~100 times of the power of the elastic element 4.

From the above descriptions, the anti-dismantle device 1 of the present invention utilizes the pin 21 disposed on the first inner surface 22 of the upper case 2 to cooperate with the cover 7, the plurality of balls 6, the magnet element 5, the elastic element 4 and the receiving part 31 disposed on the second inner surface 32 of the lower case 3. Therefore, the upper case 2 and the lower case 3 are fastened to each other as the upper case 2 and the lower case 3 are assembled together. Comparing with the conventional anti-dismantle device by using screws to assemble the upper case and lower case, the anti-dismantle device 1 of the present invention has no detachable portion in the outward appearance thereof. Consequently, unintended disassembly of the upper case 2 and the lower case 3 of the anti-dismantle device 1 by the user is prevented. Moreover, as the upper case 2 and the lower case 3 of the anti-dismantle device 1 is required to be disassembled, a magnet member 8 is needed to be employed to perform the disassembly of the anti-dismantle device 1. Therefore, the anti-dismantle effect of the anti-dismantle device 1 is promoted. Furthermore, as the upper case 2 and the lower case 3 of the anti-dismantle device 1 is required to be disassembled, the magnet member 8 is utilized to attract the magnet element 5 so as to compress the elastic element 4. Meanwhile, the plurality of balls 6 are free to be removed from the groove 211 of the pin 21 so that the upper case 2 and the lower case 3 are disassembled with each other. It is obvious that the upper case 2 and the lower case 3 are disassembled by non-destructive method. Therefore, as the upper case 2 and the lower case 3 are disassembled with each other, the anti-dismantle device 1 has no irreversible demolition vestige formed in the outward appearance thereof and damage of the upper case 2 and the lower case 3 is prevented.

In some embodiments, as shown in FIGS. 3 and 4, the cover 7 includes a first through hole 73. The first through hole 73 runs through the center of the cover 7. The magnet element 5 includes a second through hole 51. The second through hole 51 runs through the center of the magnet element 5. The elastic element 4 includes a spiral structure and includes a third through hole 41. The third through hole 41 runs through the center of the spiral structure of the elastic element 4. Moreover, the first through hole 73 of the cover 7, the second through hole 51 of the magnet element 5 and the third through hole 41 of the elastic element 4 are corresponding in position to each other. Namely, the first through hole 73 of the cover 7, the second through hole 51 of the magnet element 5 and the third through hole 41 of the elastic element 4 are aligned with each other. Therefore, at least portion of the pin 21 of the upper case 2 penetrates through the first through hole 73 of the cover 7, the receiving part 31, the second through hole 51 of the magnet element 5 and the third through hole 41 of the elastic element 4 and is disposed in the accommodation space 33.

In an embodiment, as the plurality of balls 6 are disposed on the magnet element 5 but the pin 21 is not disposed in the accommodation space 33, the anti-dismantle 1 uses at least one of the following two methods for avoiding the plurality of balls 6 to fall into the second through hole 51 of the magnet element 5. In the first method as shown in FIGS. 4 and 5, the plurality of balls 6 are disposed on the second side 50b of the magnet element 5. The second side 50b of the magnet element 5 is gradually inclined from an inner periphery 52 of the magnet element 5 to an outer periphery 53 of the magnet element 5. In the second method as shown in FIGS. 4 and 5, the cover 7 includes an arc surface 72 and a protrusion 71. The arc surface 72 is formed from one side of the cover 7 and adjacent to the plurality of balls 6. One side of the arc surface 72 is connected to an opening of the first through hole 73 adjacent to the second inner surface 32 of the lower case 3. Moreover, a part of the arc profile of the arc surface 72 matches with the arc profile of a periphery surface of the ball 6. As the upper case 2 is assembled with the lower case 3, the arc surface 72 is partially in contact with the plurality of balls 6. The protrusion 71 is protruded from the intersection between the arc surface 72 and the first through hole 73, and the protrusion 71 is extending outwardly toward the second inner surface 32 of the lower case 3. The distance between the protrusion 71 and the magnet element 5 is less than the diameter of the ball 6. Therefore, as the plurality of balls 6 are disposed on the magnet element 5 but the pin 21 is not disposed in the accommodation space 33, the protrusion 71 limits and maintains the plurality of balls 6 to be disposed on the magnet element 5. Hence, the plurality of balls 6 are prevented from falling into the second through hole 51 of the magnet element 5.

Please refer to FIG. 6 again. In some embodiments, a horizontal depth h of the groove 211 is equal to 0.6 times of the radius R of the ball 6. Moreover, the groove 211 is a cone-shaped groove and includes a first surface 212 and a second surface 213. Preferably but not exclusively, an angle formed between the first surface 212 and the second surface 213 is 120 degrees.

Figure 8A:
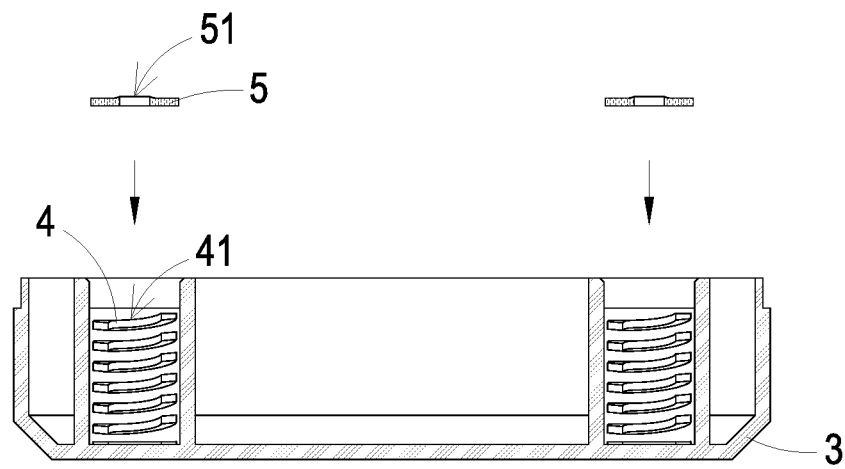
FIGS. 8A to 8F are flowcharts illustrating an exemplary method of assembling the anti-dismantle device of FIG. 1.
Figure 8B:
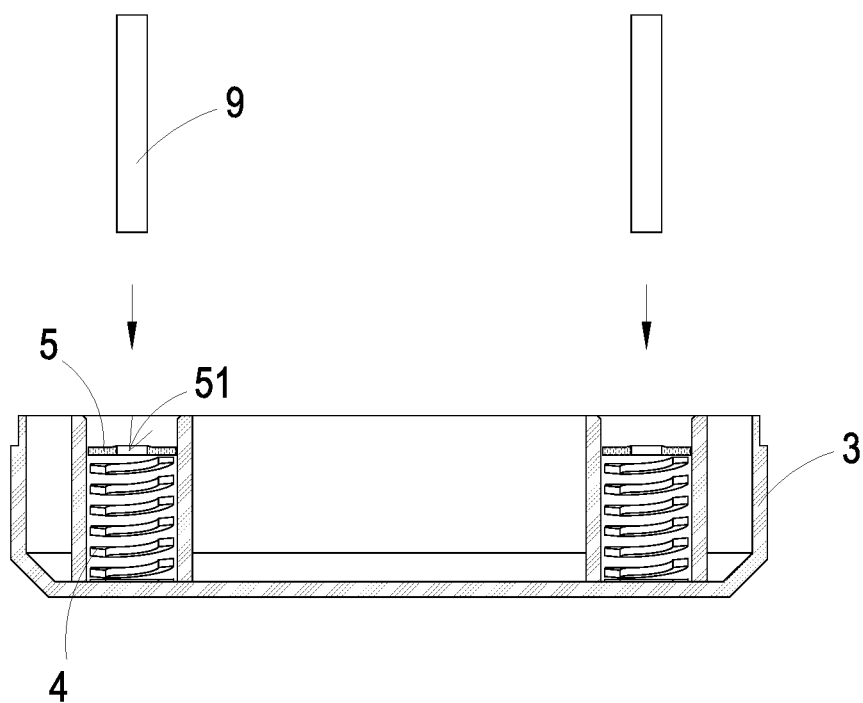
Figure 8C:
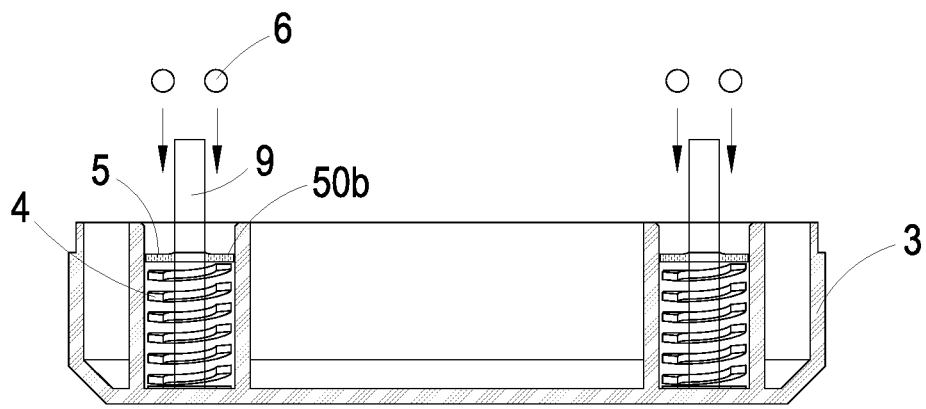
Figure 8D:
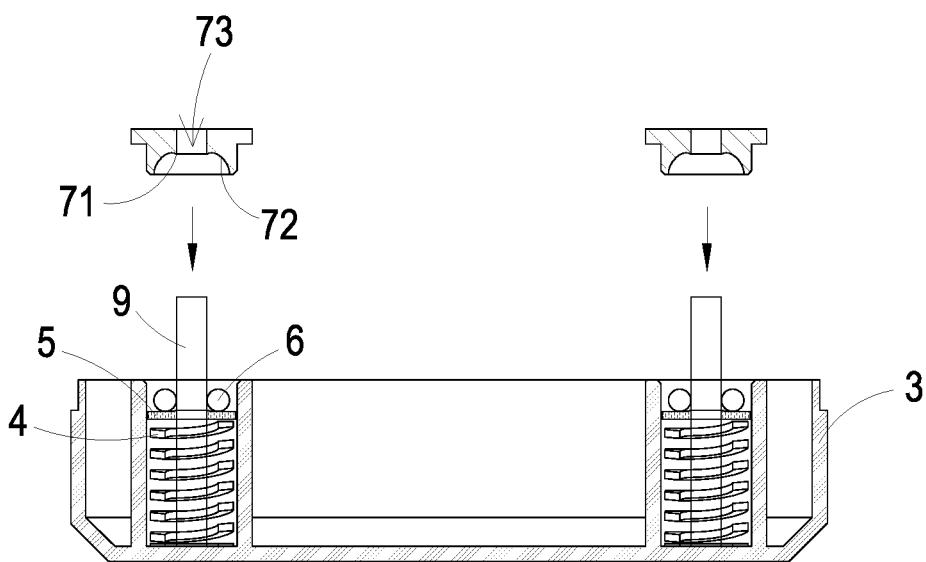
Figure 8E:
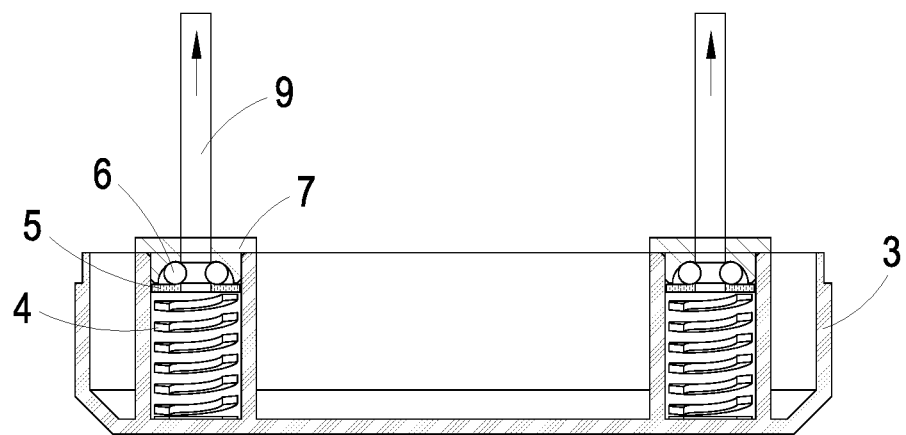
Figure 8F:
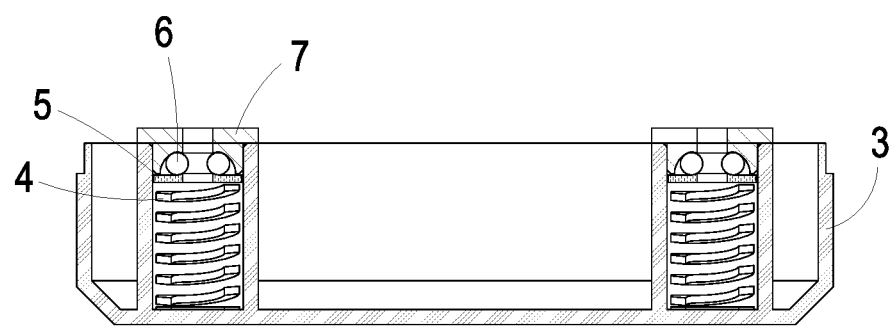

An exemplary method of assembling the elastic element 4, the magnet element 5, the plurality of balls 6, the cover 7 and the receiving part 31 of the anti-dismantle device 1 are described below. FIGS. 8A to 8F are flowcharts illustrating an exemplary method of assembling the anti-dismantle device of FIG. 1. Firstly, as shown in FIG. 8A, the elastic element 4 and the magnet element 5 are disposed in the accommodation space 33 in sequence. The first end 40a of the elastic element 4 presses against the second inner side 32 of the lower case 3. The magnet element 5 is located between the elastic element 4 and the opening of the accommodation space 33. The second through hole 51 of the magnet element 5 is corresponding in position to the third through hole 41 of the elastic element 4. Then, as shown in FIG. 8B, a position pillar 9 is provided to penetrate through the second through hole 51 of the magnet element 5 and the third through hole 41 of the elastic element 4. Then, as shown in FIG. 8C, the plurality of balls 6 are disposed in the accommodation space 33 and in contact with the second surface 50b of the magnet element 5. Since the position pillar 9 penetrates through the second through hole 51 and the third through hole 41, the plurality of balls 6 are prevented from falling into the second through hole 51 and the third through hole 41. Then, as shown in FIG. 8D, the cover 7 is disposed around the position pillar 9 through the first through hole 73. The cover 7 is fitted in the receiving part 31 and covers the opening of the accommodation space 33. Meanwhile, the protrusion 71 limits and maintains the plurality of balls 6 to be disposed on the magnet element 5. Then, as shown in FIG. 8E, the position pillar 9 is removed. Since the protrusion 71 limits and maintains the plurality of balls 6 to be disposed on the magnet element 5, the plurality of balls 6 are prevented from falling into the second through hole 51 of the magnet element 5 and the third through hole 41 of the elastic element 4. Then, as shown in FIG. 8F, the lower case 3, the elastic element 4, the magnet element 5, the plurality of balls 6 and the cover 7 are assembled completely.

From the above descriptions, the present invention provides an anti-dismantle device. The anti-dismantle device utilizes the pin disposed on the first inner surface of the upper case to cooperate with the cover, the plurality of balls, the magnet element, the elastic element and the receiving part disposed on the second inner surface of the lower case 3. Therefore, the upper case and the lower case are fastened to each other as the upper case and the lower case are assembled together. Comparing with the conventional anti-dismantle device by using screws to assemble the upper case and lower case, the anti-dismantle device of the present invention has no detachable portion in the outward appearance thereof. Consequently, unintended disassembly of the upper case and the lower case of the anti-dismantle device by the user is prevented. Moreover, as the upper case and the lower case of the anti-dismantle device is required to be disassembled, a magnet member is needed to be employed to perform the disassembly of the anti-dismantle device. Therefore, the anti-dismantle effect of the anti-dismantle device is promoted. Furthermore, as the upper case and the lower case of the anti-dismantle device is required to be disassembled, the magnet member is utilized to attract the magnet element so as to compress the elastic element. Meanwhile, the plurality of balls are free to be removed from the groove of the pin so that the upper case and the lower case are disassembled with each other. It is obvious that the upper case and the lower case are disassembled by non-destructive method. Therefore, as the upper case and the lower case are disassembled with each other, the anti-dismantle device has no irreversible demolition vestige formed in the outward appearance thereof and damage of the upper case and the lower case is prevented.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:
1. An anti-dismantle device, comprising:
an upper case comprising at least one pin, wherein the pin comprises a groove;
a lower case detachably assembled with the upper case and comprising at least one receiving part, wherein the receiving part is corresponding in position to the pin and comprises an accommodation space;
at least one elastic element disposed in the accommodation space;
at least one magnet element disposed in the accommodation space and located between the elastic element and an opening of the accommodation space, wherein the magnet element presses against the elastic element;
a plurality of balls disposed in the accommodation space and located between the magnet element and the opening of the accommodation space, wherein the plurality of balls are in contact with the magnet element; and
at least one cover fitted in the receiving part and configured to cover the opening of the accommodation space;
wherein at least portion of the pin penetrates through the cover, the receiving part, the magnet element and the elastic element and is disposed in the accommodation space, wherein each of the plurality of balls is partially disposed in the groove of the pin, wherein in response to an elastic force of the elastic element, the magnet element cooperates with the cover to press against the plurality of balls for allowing the plurality of balls to be fastened in the groove of the pin, so that the upper case and the lower case are assembled together.

2. The anti-dismantle device according to claim 1, wherein the cover comprises a first through hole, the magnet element comprises a second through hole, and the elastic element comprises a third through hole, wherein the first through hole, the second through hole and the third through hole are corresponding in position to each other, wherein at least portion of the pin penetrates through the first through hole, the receiving part, the second through hole and the third through hole and is disposed in the accommodation space.

3. The anti-dismantle device according to claim 2, wherein the magnet element is a magnet disc having a hollow structure, and the second through hole runs through a center of the magnet element, wherein one side of the magnet element is adjacent to the plurality of balls and is gradually inclined from an inner periphery of the magnet element to an outer periphery the magnet element.

4. The anti-dismantle device according to claim 2, wherein the cover comprises an arc surface and a protrusion, the arc surface is formed from one side of the cover and adjacent to the plurality of balls, one side of the arc surface is connected to an opening of the first through hole adjacent to the lower case, the protrusion is protruded from an intersection between the arc surface and the first through hole, and the protrusion is extending outwardly toward the lower case, wherein the distance between the protrusion and the magnet element is less than the diameter of the ball.

5. The anti-dismantle device according to claim 1, wherein a horizontal depth of the groove is equal to 0.6 times of a radius of the ball.

6. The anti-dismantle device according to claim 1, wherein the groove is a cone-shaped groove and comprises a first surface and a second surface, wherein an angle formed between the first surface and the second surface is 120 degrees.

7. The anti-dismantle device according to claim 1, wherein the upper case and the pin are integrally formed into one piece.

\* \* \* \* \*